(12) United States Patent
Burgueno et al.

(10) Patent No.: US 9,438,139 B2
(45) Date of Patent: Sep. 6, 2016

(54) ENERGY HARVESTING DEVICES FOR LOW FREQUENCY APPLICATIONS

(71) Applicant: Board of Trustees of Michigan State University, East Lansing, MI (US)

(72) Inventors: Rigoberto Burgueno, East Lansing, MI (US); Nizar Lajnef, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 346 days.

(21) Appl. No.: 13/960,356

(22) Filed: Aug. 6, 2013

(65) Prior Publication Data

US 2014/0070670 A1    Mar. 13, 2014

Related U.S. Application Data

(60) Provisional application No. 61/680,071, filed on Aug. 6, 2012.

(51) Int. Cl.
*H02N 2/18* (2006.01)
*H01L 41/113* (2006.01)

(52) U.S. Cl.
CPC .............. *H02N 2/186* (2013.01); *H02N 2/18* (2013.01); *H01L 41/1136* (2013.01)

(58) Field of Classification Search
CPC ................................ H02N 2/18; F23Q 3/002
USPC ......................................... 310/339, 330, 332
See application file for complete search history.

(56) References Cited

U.S. PATENT DOCUMENTS

| | | | | |
|---|---|---|---|---|
| 2006/0175937 A1* | 8/2006 | Clingman | .............. | H02N 2/186 310/339 |
| 2007/0228890 A1* | 10/2007 | Zanella | .................. | G08G 1/095 310/339 |
| 2009/0152990 A1* | 6/2009 | Brown | ...................... | F03G 5/06 310/339 |
| 2010/0289271 A1* | 11/2010 | DiMauro | .............. | B60C 23/041 290/1 R |
| 2011/0204752 A1* | 8/2011 | Gao | ........................ | H02N 2/186 310/339 |

(Continued)

FOREIGN PATENT DOCUMENTS

EP          1529301          4/2010

OTHER PUBLICATIONS

Seok-Min-Jung, Energy-harvesting device with mechanical frequency-up conversion mechanism for increased power efficiency and wideband operation, Mar. 19, 2010.*

(Continued)

*Primary Examiner* — Derek Rosenau
*Assistant Examiner* — Bryan Gordon
(74) *Attorney, Agent, or Firm* — Harness, Dickey & Pierce, P.L.C.

(57) ABSTRACT

An energy harvesting device has been developed for low frequency applications. The energy harvesting device is comprised of a buckling member having a longitudinal axis and configured to exhibit multiple snap-through events in response to a deformation applied axially thereto, where the buckling member is constrained laterally in relation to the longitudinal axis; and at least one cantilever extends outwardly from the buckling member. The cantilever(s) is coated with a piezoelectric material and supports a mass disposed at an opposing end from which it is attached to the buckling member. In this arrangement, the buckling member is able to respond to axial deformations occurring at a frequency less than one Hertz.

16 Claims, 18 Drawing Sheets

(56) References Cited

U.S. PATENT DOCUMENTS

2011/0291526 A1* 12/2011 Abramovich ....... H01L 41/0835
  310/339
2011/0304240 A1* 12/2011 Meitav ................ A61N 1/3785
  310/319

OTHER PUBLICATIONS

J. Twiefel et al "Survey on broadband techniques for vibration energy harvesting", Journal of Intelligent Material Systems and Structures, published online (2013).

S. Pellegrini et al "Bistable vibration energy harvesters: A review", Journal of Intelligent Material Systems and Structures, published online (2012).

R. Harne et al "A review of the recent research on vibration energy harvesting via bistable systems", Smart Materials and Structures, (2013).

Y Gerson, et al "Design considerations of a large-displacement multistable micro actuator with serially connected bistable elements", Finite Elements in Analysis and Design 49 (2012).

H. Pham et al "A quadristable compliant mechanism with a bistable structure embedded in a surrounding beam structure", Sensors and Actuators A 167 (2011).

J. Qiu, et al "A Curved-Beam Bistable Mechanism", Journal of Microelectromechanical Systems, vol. 13, No. 2 (2004).

* cited by examiner

Case 1: [0°/90°/90°/0°]

Case 3: [0°/45°/-45°/0°]

Case 5: [30°/0°/90°/-30°]

Case 6: [30°/-30°/-30°/30°]

Case b: Circumferential-2

Case d: Scatter

Case g: Axial-3

Case h: Checkerboard

ENERGY HARVESTING DEVICES FOR LOW FREQUENCY APPLICATIONS

CROSS-REFERENCE TO RELATED APPLICATIONS

This application claims the benefit of U.S. Provisional Application No. 61/680,071, filed on Aug. 6, 2012. The entire disclosure of the above application is incorporated herein by reference.

FIELD

The present disclosure relates generally to energy harvesting devices and, more particularly, to methods for energy generation and conversion in the unexplored quasi-static frequency range less than one Hertz.

BACKGROUND

One of the major obstacles that are limiting the development of deployable integrated sensing and actuation solutions in smart structures is the scarcity of power. Several applications require of the use of miniaturized low-powered sensing and actuation systems. These applications include civil and mechanical structures monitoring, machinery/equipment monitoring, home automation, efficient office energy control, surveillance and security, agricultural management, long range asset tracking, and remote patient monitoring. As a result, the power consumption, speed and size of integrated circuits have dramatically decreased. It is now becoming feasible to embed electronics in everyday objects to potentially enhance their performance. For example, a typical wireless sensor node would consist of an embedded microprocessor, digital logic circuits, radio receiver, radio transmitter, timer and an analog-to-digital converter. Current commercial electronics have sleep-power consumptions as low as 200 nW. The processor is capable of 0.5 million operations per second at 350 µW power consumption. Commercial sensor nodes require about 50 mW of power to run the sampling, processing and communication functions. These sensors would typically process and transmit approximately 500 bytes of data per milli-joule of energy. Recently, a data computation and logging system for sensing applications have been reported to achieve data processing and storage at power levels below 1 µW. The actual power consumption in real applications strongly depends on the complexity of the processed signal quantity and on the number of times per second it has to be transmitted. Several recent practical implementations of sensor nodes showed that 20 µW to 100 µW is enough to process and transmit data. The value of 100 µW is considered representative of the latest developments of relatively complex nodes for systems operating at relative high data-rate.

In spite of the significant developments in the area of localized sensing and actuation, most of the developed systems to date still rely on batteries, thus limiting the lifetime of the device as well as the diagnosis possibilities. Therefore, energy harvesting has been a topic given great attention in recent years as a viable alternative. A myriad of potential energy sources have been identified. Among the identified methods, piezoelectric harvesters are the most promising for deployment in structures, given the size limitations and the possibility of being embedded within the construction material.

A major disadvantage that hinders the use of piezoelectric scavengers in most of the civil and mechanical applications is their narrow-band frequency response. For example, FIG. 1 shows the frequency response of a PZT generator of dimensions (40 mm×10 mm×0.5 mm) for both surface mounted and cantilever vibrator configurations (a tip mass of 3 g is attached in vibration mode). FIG. 1 illustrates the importance of frequency matching for an optimized energy delivery. In general, a vibration based scavenger with an overall volume limited to less than 5 $cm^3$ will exhibit a resonant frequency in the range 50-300 Hz, while most civil structures have a fundamental vibration mode at frequencies less than 5 Hz. This mismatch significantly limits the levels of extractable power. Thus, improving the conversion capabilities of these systems, while obeying all necessary constrains, is critical toward a successful implementation of energy harvesting strategies.

This section provides background information related to the present disclosure which is not necessarily prior art.

SUMMARY

This section provides a general summary of the disclosure, and is not a comprehensive disclosure of its full scope or all of its features.

In one aspect of this disclosure, an energy harvesting device has been developed for low frequency applications. The energy harvesting device is comprised of a buckling member having a longitudinal axis and configured to exhibit a snap-through event in response to a force applied axially thereto, where the buckling member is constrained laterally in relation to the longitudinal axis; and at least one cantilever extends outwardly from the buckling member. The cantilever(s) is coated with a piezoelectric material and supports a mass disposed at an opposing end from which it is attached to the buckling member. In this arrangement, the buckling member is able to respond to axial deformations occurring at a frequency less than one Hertz.

In some embodiments, the buckling member is further defined as a strip, where the strip is defined by two opposing planar surfaces substantially larger than remaining surfaces of the strip. A first wall may be disposed adjacent to a first of the planar surfaces of the strip and a second wall may be disposed adjacent to a second of the planar surfaces of the strip, such that the walls laterally constrain the snap-through events of the strip.

In other embodiments, the buckling member is further defined as a hollow cylinder, such that the snap-through events can be generated, for example by the geometry of the cylinder, by the anisotropy that can be obtained by using laminated composite materials, by modifying the material distribution within the cylinder, by modifying the stiffness distribution with the cylinder and/or by providing inner or outer constraints.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
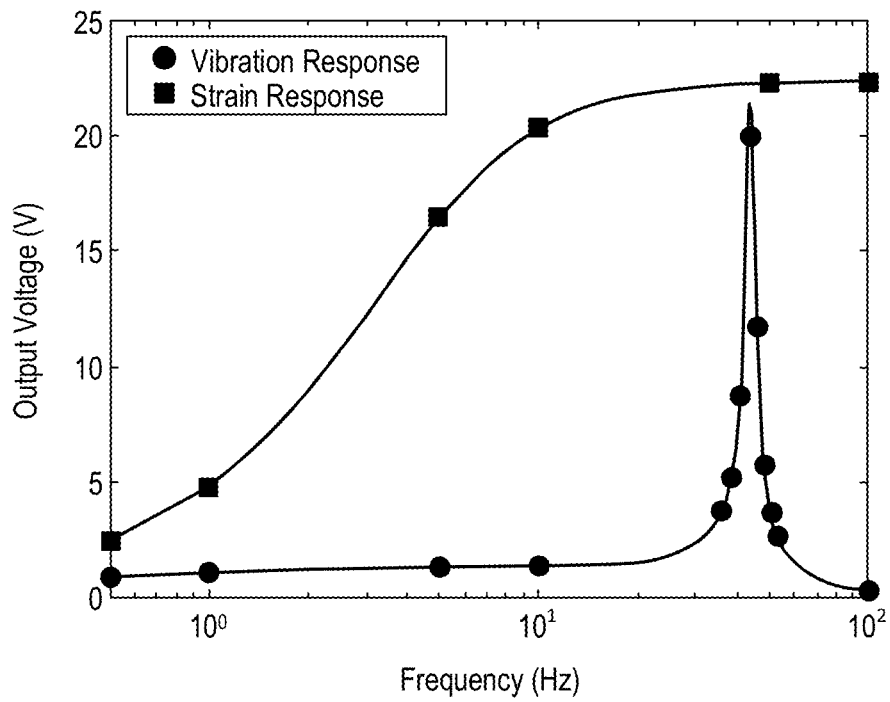
FIG. 1 is a graph depicting frequency response of piezoelectric beam loaded in the strain and vibration modalities, respectively.
Figure 2:
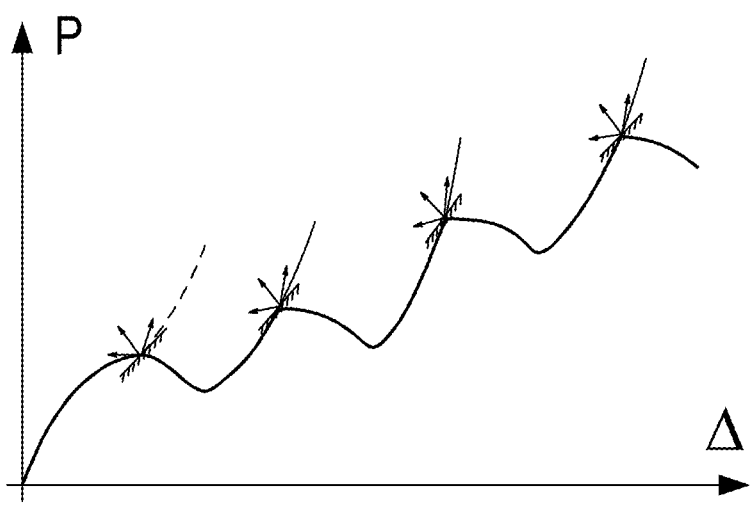
FIG. 2 is a graph depicting characteristics of multistable post-buckling behavior.

The theory of buckling and postbuckling of elastic structures, and its applications is an area of research that has been studied extensively over the past 80 or more years. While most efforts have been guided by the need to develop improved understanding for preventing global and local instability, recent attention has been paid to the potential of using postbuckling behavior for deployable and active structures. Within the current research concept, if snap-through buckling can be used as a means to increase the frequency of response of a vibrating energy harvester for increased wideband operation, then it is of interest to have not only two positions of postbuckling equilibrium (bistable configuration) but multiple stable positions. Thus, is there a way to obtain and control multistable postbuckling response as shown in FIG. 2? The answer is yes, as long as lateral constrains are provided to the buckling element so as to allow multiple stable post-buckling equilibrium configurations.

Figure 3A:
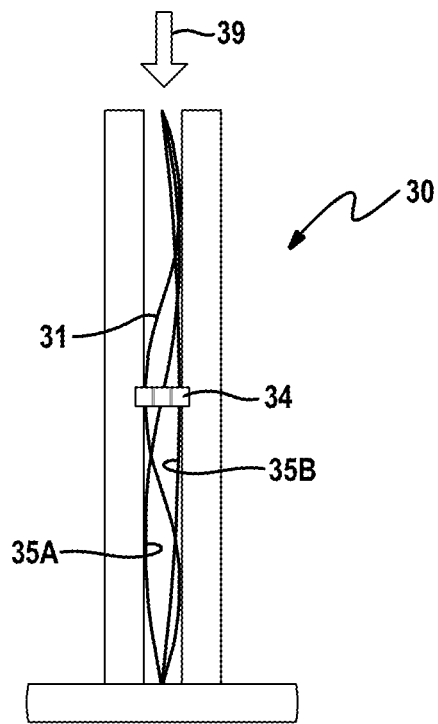
FIGS. 3A and 3B are a perspective view and a side view, respectively, of an example energy harvesting device employing a buckling strip.
Figure 3B:
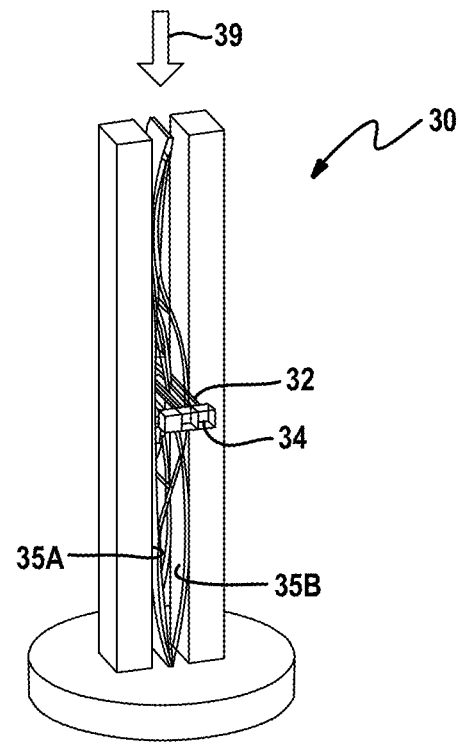
Figure 3C:
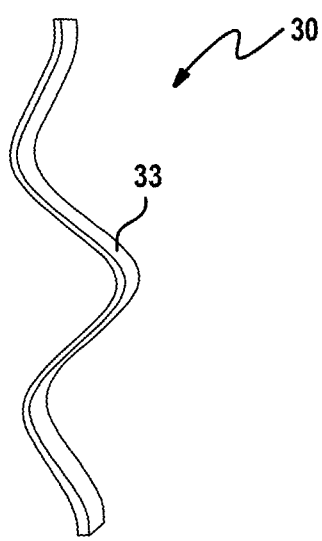
FIG. 3C is a perspective view of the buckling strip.

FIGS. 3A and 3B illustrate an example embodiment of an energy harvesting device 30 which employs a buckling strip in accordance with this operating principle. The energy harvesting device 30 is comprised generally of a buckling member 31 and a cantilever 32 having a piezoelectric material disposed on a surface thereof. In this example embodiment, the buckling member 31 is further defined as a strip, where the strip is defined by two opposing planar surfaces 33 substantially larger than remaining surfaces of the strip as better seen in FIG. 3C. Other similar shapes are contemplated for a strip serving as a buckling member.

In response to a force applied axially to the strip as indicated at 39, the strip is configured to exhibit a snap-through buckling event. By constraining the strip laterally, the strip is able to exhibit multiple snap-through events between stable positions. Three of such configurations, or buckling mode shapes are shown in FIG. 3A. In the example embodiment, the strip 31 is laterally constrained by two continuous surfaces or walls 35A, 35B, where a first wall 35A is disposed adjacent to a first of the planar surfaces and a second wall 35B is disposed adjacent to a second of the planar surface of the strip.

In an alternative embodiment, the lateral constraint of the strip can be applied by discrete elements placed on both side of the planar surfaces of the strip. For example, the discrete elements could take the form of pins or protrusions that would create the required transverse constraining force when the deformed strip touches the elements. It is understood that there can be multiple discrete elements placed on either side of the strip and the spacing between them can control the buckling modes and the snap-through events that the strip can experience. Other continuous or discrete means for laterally constraining the strip are also contemplated by this disclosure.

Multistable behavior of strips has been analytically and experimentally proven to be possible provided that discrete or continuous lateral constraints are provided. In such conditions, the increased transverse deformations from a buckled shape under axial compressive demands would lead to contact interaction with a discrete or continuous boundary, such as that provided by the two walls 35A, 35B. The contact interaction would lead to secondary restraining forces that allow the development of a higher order buckling configuration. Increased transverse deformations of the second postbuckled configuration would lead to new transverse forces from the lateral constraints thus inducing a third postbuckled stable configuration, as best seen in FIG. 3B. And so forth. Unlike conventional energy harvesting devices, the buckling strip in the example embodiment is able to experience a snap-through event from forces occurring at a frequency less than one Hertz.

The cantilever 32 has one end coupled to the strip 31 and a mass 34 disposed at an opposing end thereof. The cantilever extends outwardly from the buckling member and can be orientated substantially transverse to the longitudinal axis of the strip. Other orientations are also contemplated. Likewise, the cantilever is preferably positioned at the location along the strip that experiences the greatest lateral acceleration during the snap-through event. However, this position can vary for different post-buckling positions. Thus, the cantilever oscillators are placed at the locations of maximum transverse amplitude of the buckling strip element. The mounting of single or multiple cantilever oscillators along the strip length is contemplated.

A piezoelectric material is disposed on one or more surfaces of the cantilever 32. Different types of piezoelectric material may be used, including but not limited to lead zirconate titanate (PZT) and semi-crystalline plastic polyvinylidene fluoride (PVDF). The piezoelectric material of the cantilever is in turn electrically connected via a harvesting circuit to an energy storage device, such as a battery. In this way, the output voltage produced by the vibrating cantilever can be captured and stored for later use.

Figure 4:
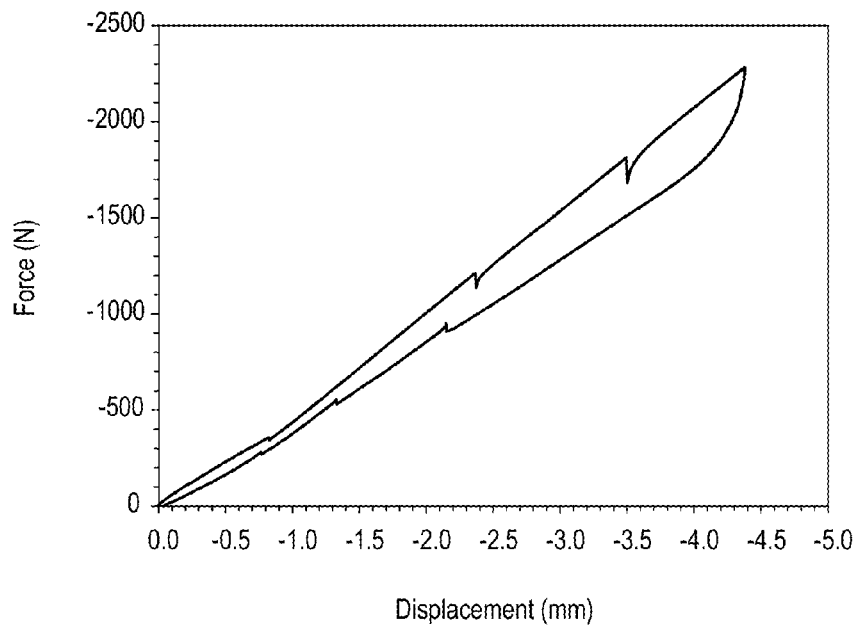
FIG. 4 is a graph depicting the post-buckling response of the example energy harvesting device.

The post-buckling response of the bilaterally constrained strip 31 was evaluated. The test setup consisted of an axially loaded polycarbonate (E=2.3 GPa) strip (L=227 mm, w=30 mm, t=4 mm) with fix-fix support conditions and with continuous bilateral constraints allowing a gap of 4 mm for transverse deformations. The reproducibility of the behavior and its cyclic response was evaluated. The force-displacement response of one loading cycle is shown in FIG. 4. The static path transitions are seen to cause discontinuities (load drops) in the load-deformation response. Also of interest is that mode jumping was present during unloading (lower branch in plot). This is important since it allows for placement of the system in a "loaded" configuration beyond several buckling states so that the system can display mode jumping behavior during loading and unloading, or under global compression and tension demand from the host material or structure.

Figure 5:
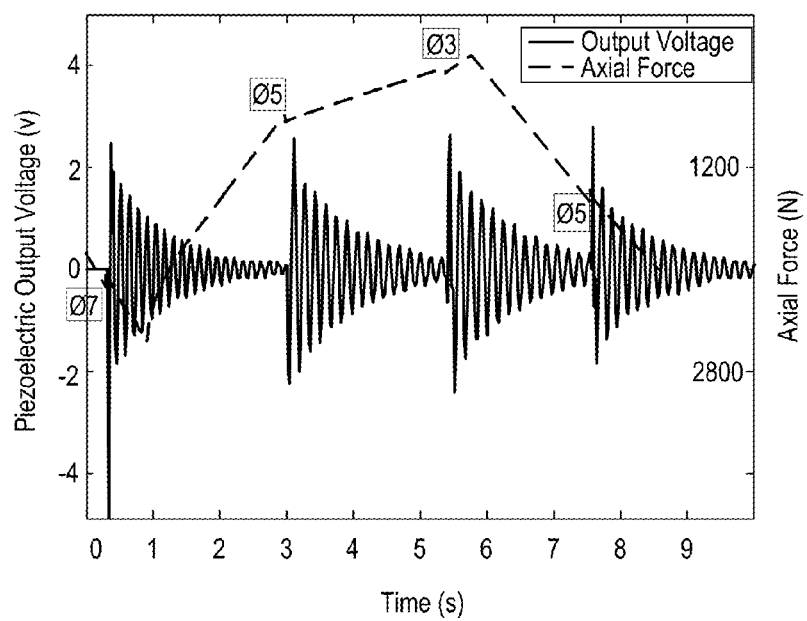
FIG. 5 is a graph illustrating the load history and resulting output voltage for the example energy harvesting device.

To evaluate the frequency-up conversion capability gained from the post-buckling behavior, the cantilever 32 was mounted at mid-span of the polycarbonate strip 31. The cantilever 32 included a PVDF film (E≈3 GPa) on a polyester cantilever strip (w=16.5 mm, L=32 mm, I=3e-5 $mm^4$) with a tip lumped mass (0.92 g). The restrained strip 31 was compressed past its fifth buckling mode as the starting position. The loading cycle was then started by compressing the strip further until past the 7th buckling mode, then unloading the strip (tension load) past the 3rd mode and then compressing again until past the 5th mode. The load histories of the strip and the voltage output from the piezoelectric material are shown in FIG. 5. It can be seen that there is an increase in the response of the cantilever in terms of voltage output and frequency of response for every static path transition (mode jump). The results show that the input signal has a frequency of about 0.11 Hz and it was transferred to a voltage output of frequency around 6.6 Hz. The voltage frequency is determined by the resonance frequency of the cantilever; hence it can be easily tuned. It was further noted that the lateral restraints leads to an impact-like load (acceleration) during the mode transitions, which becomes the input to the oscillator. The PVDF oscillator then responds in free vibration. As the time between mode transitions reduces (increase in input frequency) the system will move to a forced vibration regime.

Figure 6A:
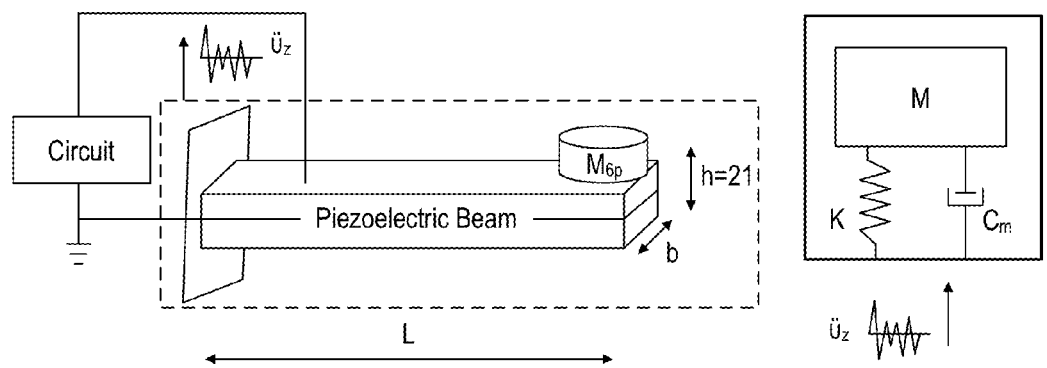
FIGS. 6A and 6B depict a model and its equivalent circuit, respectively, for the piezoelectric element of the example energy harvesting device.
Figure 6B:
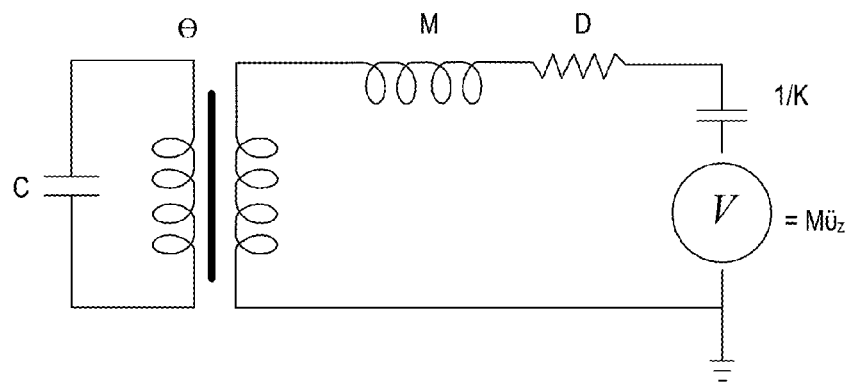

FIG. 6A depicts a model for the piezoelectric element of the example energy harvesting device. Several physical constants are used in piezoelectric modeling including: (1) the permittivity $\in$ (or dielectric constant), defined as the dielectric displacement per unit electric field, (2) the piezoelectric charge constant $d_{ij}$, defined as the electric polarization generated in a material per unit mechanical stress applied to it. Adequate matching of both the generated voltage and the capacitance (C) to the applied mechanical load magnitude and frequency content is critical for maximum electrical energy generation. It is understood that the response for different piezoelectric materials can be investigated and tailored to the application. A schematic of an example circuit for harvesting energy from the piezoelectric material is depicted in FIG. 6B. Other circuit arrangements for interfacing with the piezoelectric material are also contemplated by this disclosure.

Figure 6C:
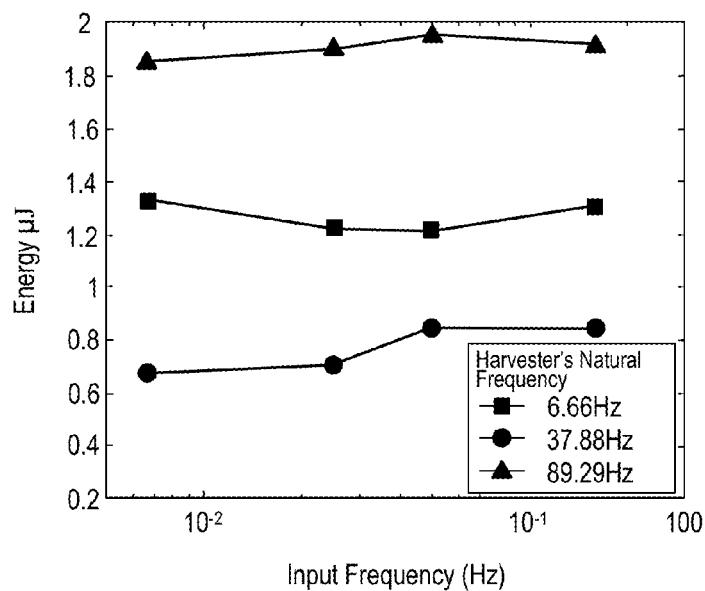
FIG. 6C is a graph illustrating harvested energy for different piezoelectric elements and input loading frequencies.

Continuing with the evaluation set forth above, the energy generated by a cantilever piezoelectric PVDF beam measured across a 10 MΩ resistor in shown in FIG. 6C. The natural frequency of the vibrator was varied in the range 10 Hz to 90 Hz by modifying the effective length of the PVDF film and the tip mass. Different curves were obtained for different input deformation rates (noted as Fi). The obtained results confirm that energy can be transferred at extremely low-rate deformations input. The levels of harvested energy as well as the output signal frequency can be tuned (optimized) by controlling the piezoelectric and the buckled column properties. The harvested energy depends on the occurrence of the snap-through events, thus the output energy levels do not depend on the frequency of the input load. Energy is transferred for any level of input frequency, which is unique to the energy harvesting device of this disclosure. It should be noted that all the presented results were obtained using PVDF oscillators, which have one of the lowest energy transfer factors. Using piezoelectric macro-fiber composites (MFC) or PZT patches would significantly increase the levels of output energy (one to two orders of magnitude).

Figure 6D:
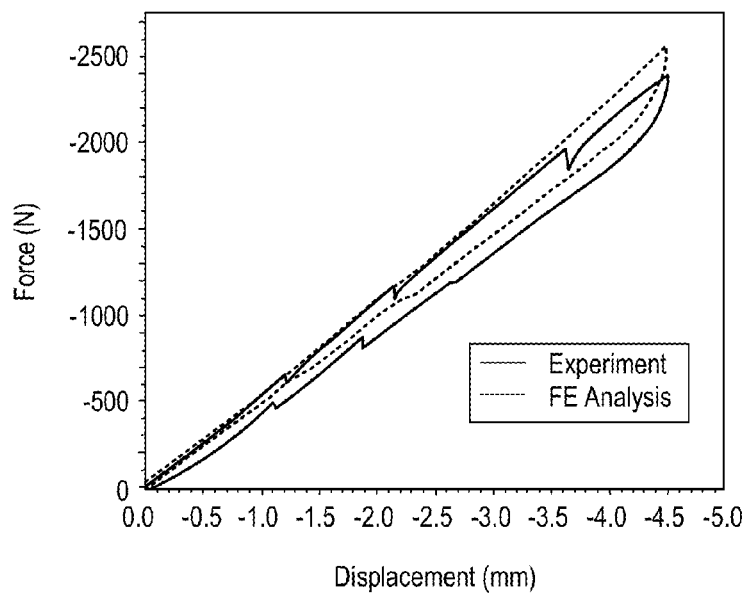
FIG. 6D is a graph is a graph comparing experimental and numerical force-displacement responses of the energy harvesting device.

Large-strain nonlinear dynamic finite element analyses were conducted on the bilaterally constrained column test. Four-node isoparametric shell elements were used to model the strip and rigid no-penetration contact behavior with friction coefficient 0.2 was defined for the interaction between the strip and side walls. The introduction of friction is important because this force creates a pseudo-softening effect on the load-deformation response as it acts against the direction of loading. Geometric imperfection was introduced to the strip by using superposition of buckling eigenmodes. An implicit dynamic analysis procedure was used. The numerically simulated force-displacement response from the models is shown in FIG. 6D together with experimental data. It can be seen that the multiple snap-through behavior was adequately captured by the FE simulations.

Figure 7:
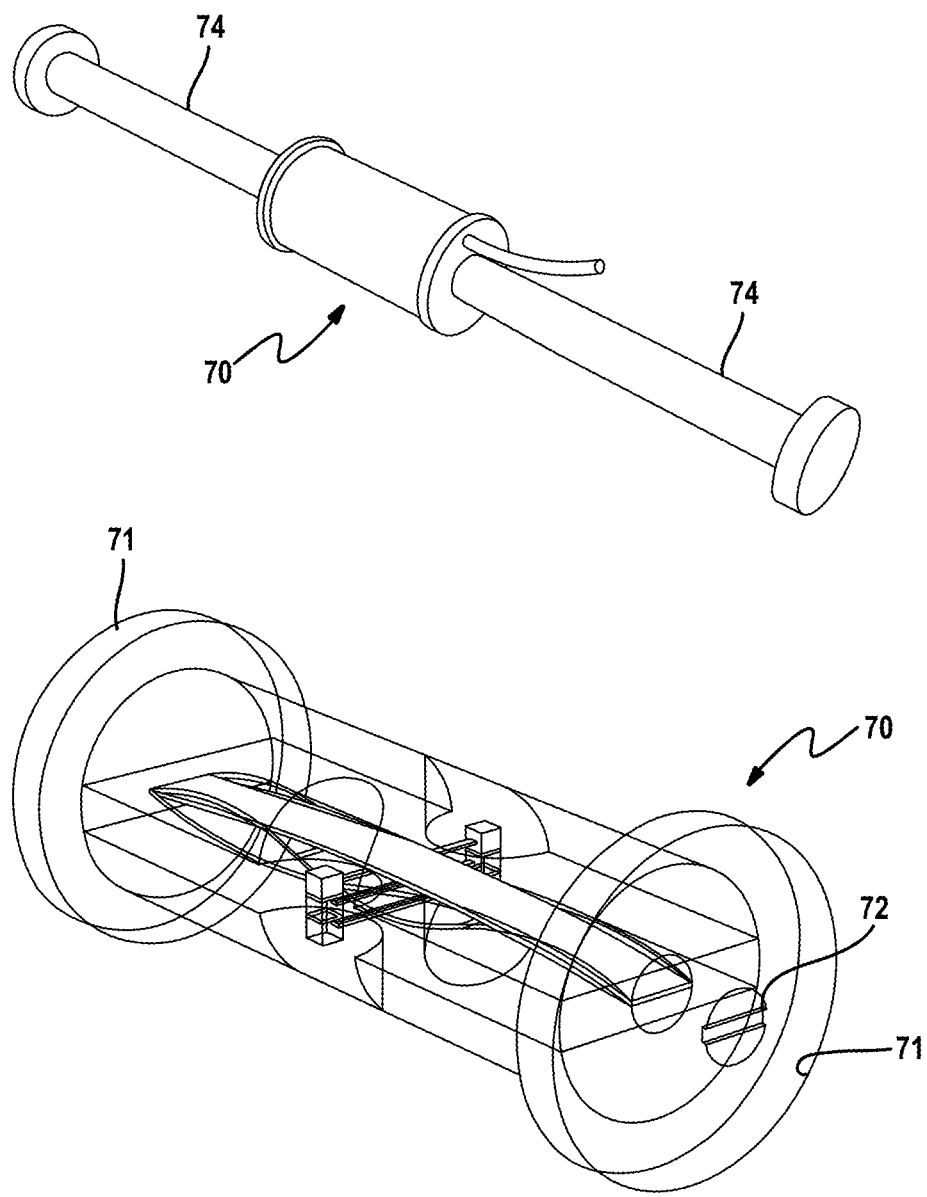
FIG. 7 is a perspective view of an example package for the energy harvesting device.

The energy harvesting device 30 may be packaged in different manners. FIG. 7 illustrates an example packaging for the energy harvesting device 30. The packaging is comprised generally of a cylindrical housing 70 which encases the energy harvesting device 30. The goal is to reduce the scale of the energy harvesters into a package that is similar to that of a vibrating wire strain gage, which houses the vibrating wire element in a cylinder of approximately 25 mm in diameter and 25-50 mm in length. This exemplary size is suitable for large civil structure, such as roads and bridges. The concept can be scaled down to smaller sizes for use in other applications, such as MEMS devices.

The housing 70 includes two end caps 71 and a means for compressive preloading the strip of the energy harvesting device. In an example embodiment, the strip is preloaded using a screw 72 threaded through one of the end caps 71.

The head of the screw is accessible on the exterior of the housing; whereas, the opposing end of the screw engages an axial end of the strip 31. By rotating the screw, the compressive preload for centering can be applied mechanically by the screw. Other techniques for preloading the strip also fall within the scope of this technique.

Figure 8:
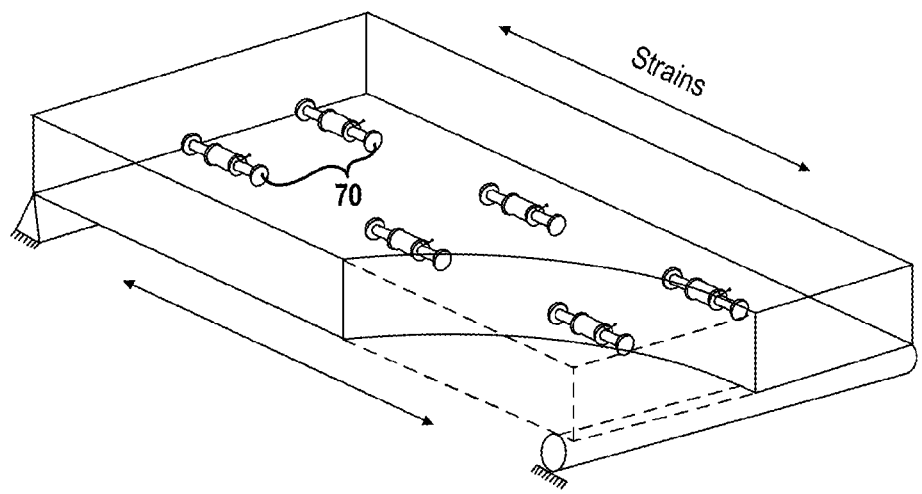
FIG. 8 is a perspective view depicting an example deployment of energy harvesting devices in a structure.

The cylindrical housing 70 may also be configured with two metal rods 74. Each rod 74 extends axially from the one of the end caps 71 and functions to better anchor the housing 70 in a structure from which energy is to be harvested. One or more of the housings 70 may be arranged in the structure as shown in FIG. 8. In particular, the housing 70 is arranged such that the longitudinal axis of the housing 70 aligns with the anticipated deformations acting thereon. For example, the longitudinal axis of the housing 70 may align with the direction in which the structure is expected to contract and expand. It is also envisioned that two or more of the housings may be aligned in different directions depending on the application.

Figure 9:
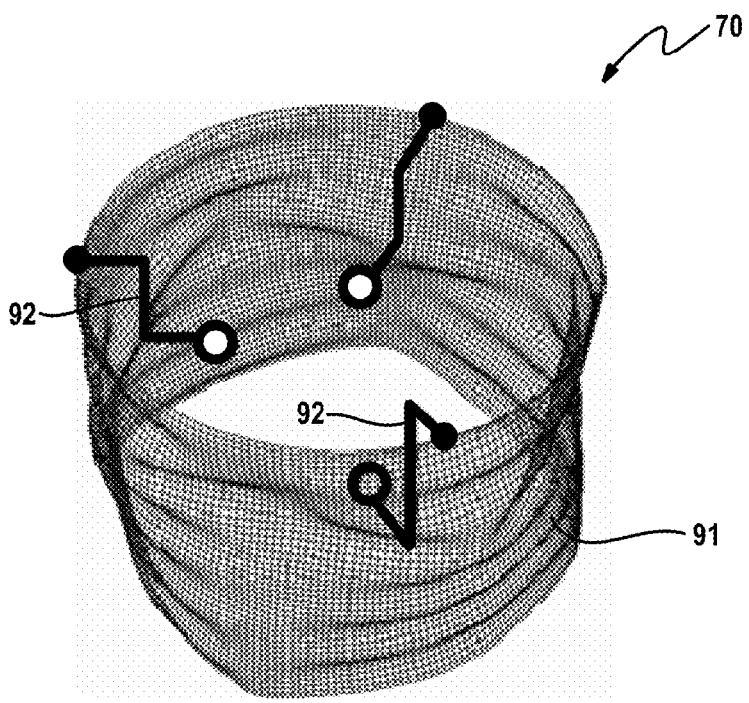
FIG. 9 is a perspective view of an alternative embodiment for an energy harvesting device employing a hollow cylindrical member.

Obtaining multiple postbuckling configurations for one dimensional elements, such as strips, requires lateral constraints. It would be of interest, however, if a similar behavior could be obtained without exterior restraints. Such a phenomenon occurs in the response of thin cylindrical shells. FIG. 9 illustrates an example embodiment of an energy harvesting device 90 that employs a buckling cylinder. The energy harvesting device 90 is comprised generally of a hollow cylinder 91. Multiple elastic post-buckling response of cylindrical shells is possible due to the inherent lateral restraint provided, for example by the circumferential radial stresses generated by the curvature. However, the large sensitivity to imperfections limits the number of stable postbuckling modes that can be attained before nonlinear local buckling dominate the response. Nonetheless, the radial curvature of the cylinder provides a restraint that allows for multistable postbuckling response when loaded in compression.

One or more cantilevers 92 are coupled at one end of the cylinder 90. The cantilevers 92 extend away from the attached surface and support a mass at a distal end thereof. It is understood that the cantilevers could extend inward from an inner surface of the cylinder or extend outward from an outer surface of the cylinder. It is also understood the cantilevers may be placed at different positions along the attachment surface.

Figure 10A:
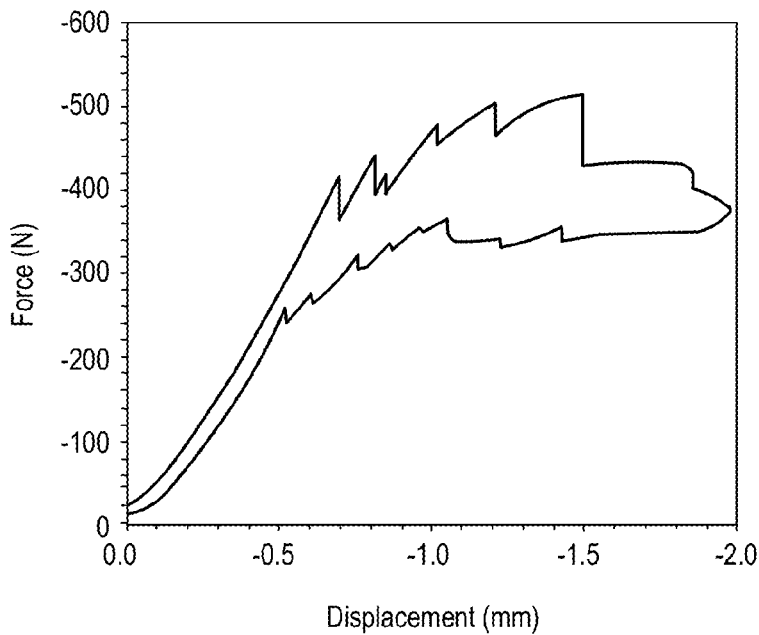
FIGS. 10A and 10B are graphs illustrating an experimental and simulated, respectively, loading cycle on the energy harvesting device depicting in FIG. 9.
Figure 10B:
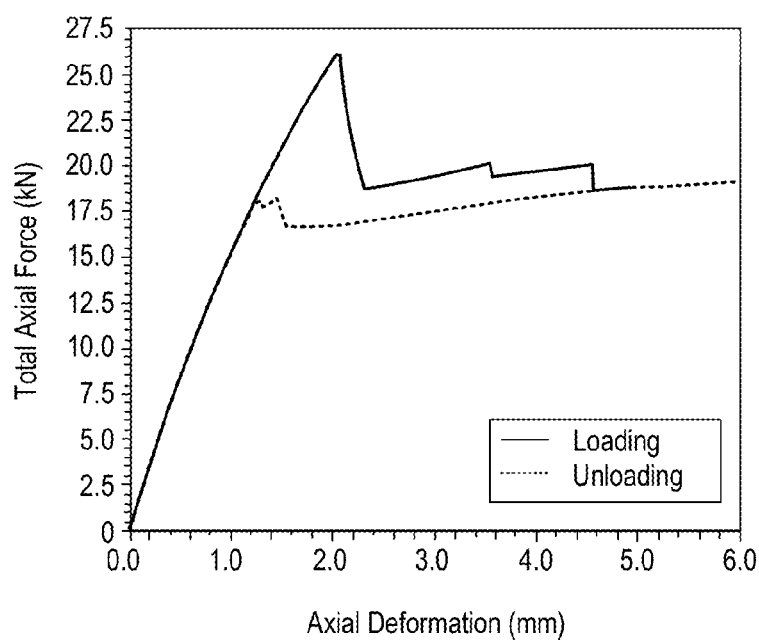
Figure 11A:
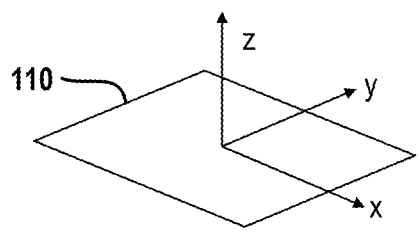
FIGS. 11A-11D are diagrams illustrating bistable laminated plates in different states.
Figure 11B:
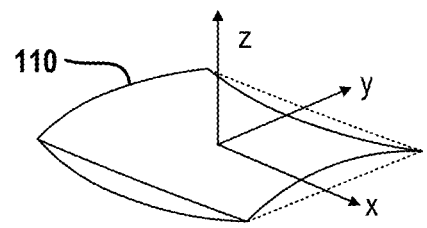
Figure 11C:
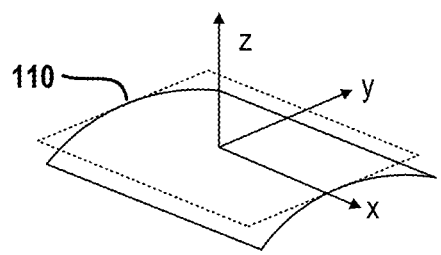
Figure 11D:
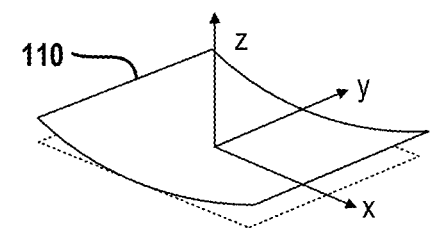

An experimental and numerical investigation was conducted to confirm that static path jumping could be achieved in cylinders under compression. FIGS. 10A and 10B illustrate an experimental and simulated loading cycle on the energy harvesting device 90, respectively. FIG. 10A shows one loading cycle for a polyester (E=21 kPa) cylinder (D=80 mm, L=152 mm, t=0.533 mm). The data show that mode jumping was attained and that deformations were fully recovered. Mode jumping also occurs during unloading. As expected, the cylinder response is influenced by multiple closely spaced bifurcation points, each a snap-through event. This poses challenges as it is of interest to have distinct and spaced buckling shapes that facilitate the tuning of behavior and maximize the energy released when switching between the post-buckled stable branches. A similar behavior was observed in numerical simulations as shown in FIG. 10B, albeit with a "cleaner" response probably due to the limited number of imperfections seeded in the model. The FEA analysis shown is on a polyester (E=21 kPa) cylinder (D=400 mm, L=600 mm, t=1.2 mm). The analysis was able to capture the major path jumping events but not the smaller ones, which most noticeably influenced the unloading response.

Understanding how the postbuckling behavior can be controlled is an important step towards harnessing such instability phenomenon. First, the equilibrium path is expected to have multiple mode transitions rather than a single bifurcation point. From a physical perspective, the number of multiple mode transitions (k) indicates the localized elastic interactions of the cylindrical shell while one larger jump may indicate damage. A second feature of interest is the magnitude of the drops in load ($\Delta P_i$, i=1, 2, 3 . . . n) and separation of the snap-through events as indicated by the end shortening ($\delta_i$, i=1, 2, 3 . . . n). It should be noted that the magnitude of the first bifurcation event is not of primary interest. Rather, maximizing the number of load drops is of more importance. Lastly, it is of interest to maximize the enclosed area in the force-displacement response as it is associated with the dissipated energy from the equilibrium path transactions.

Research has shown that the geometry of a cylindrical shell dictates their buckling response, and that obtaining multiple local buckling patterns requires cylinders with a small length to radius ratio (L/R) and a large radius thickness (R/t) ratio. Thus, the base cylinder used for this study had an effective length of 203 mm and internal diameter of 203 mm. The thickness varied from 1.32 mm to 0.28 mm depending on the material design as described in the following sections. It is understood that cylinders having different dimensions fall within the scope of this disclosure.

Anisotropic coupling effects in composite laminates are known to reduce the bucking capacity of cylindrical shells. Coupling terms are thus generally avoided through special laminate designs. However, anisotropic coupling can provide useful response characteristics. Thus, coupling terms may help induce local mode jumps and trigger desirable equilibrium paths in the postbuckling response.

Eight 4-ply CFRP cylinders with laminate stacking sequences exhibiting different coupling behavior, see Table 1, were considered. The cylinders were assumed to be made from unidirectional carbon/epoxy tape with a ply thickness of 0.1397 mm and ply properties of: $E_{11}$=144.8 GPa; $E_{22}$=9.655 GPa; $G_{12}$=5.862 GPa; $v_{12}$=0.25.

TABLE 1

Postbuckling response of CFRP cylinders with different laminate designs.

| # | Laminate Stacking Sequence | Coupling Terms | Structural Properties (GPa) | | | | $P_1$ (kN) | $|\Delta P_1|$ (kN) | $\delta_1$ (mm) | A (J) | k |
|---|---|---|---|---|---|---|---|---|---|---|---|
| | | | $E_x$ | $E_y$ | $G_{xy}$ | $V_{xy}$ | | | | | |
| 1 | [0°/90°]$_s$ | N/A | 77.5 | 77.5 | 5.86 | 0.03 | 23.8 | 5.66 | 0.76 | 14.96 | 2 |
| 2 | [90°/0°]$_{2T}$ | $B_{11}$, $B_{22}$ | 48 | 9.8 | 10.6 | 0.9 | 24.9 | 2.63 | 0.2 | 6.189 | 4 |
| 3 | [0°/45°/−45°/0°] | $B_{16}$, $B_{26}$ | 82.8 | 20.5 | 17.8 | 0.57 | 28.2 | 3.95 | 0.34 | 16.88 | 6 |
| 4 | [45°$_2$/−45°$_2$] | $B_{16}$, $B_{26}$ | 17.4 | 17.4 | 16 | 0.49 | 17.2 | 4.27 | 1.10 | 7.062 | 2 |

TABLE 1-continued

Postbuckling response of CFRP cylinders with different laminate designs.

| # | Laminate Stacking Sequence | Coupling Terms | Structural Properties (GPa) | | | | $P_1$ (kN) | $|\Delta P_1|$ (kN) | $\delta_1$ (mm) | A (J) | k |
|---|---|---|---|---|---|---|---|---|---|---|---|
| | | | $E_x$ | $E_y$ | $G_{xy}$ | $V_{xy}$ | | | | | |
| 5 | [30°/0°/90°/−30°] | $B_{11}, B_{22}, B_{16}, B_{26}$ | 47.7 | 33.9 | 7.9 | 0.05 | 22.6 | 0.01 | 0.14 | 8.775 | 5 |
| 6 | [±30°]$_s$ | $D_{16}, D_{26}$ | 53.1 | 12 | 29.6 | 1.3 | 24.8 | 4.87 | 0.42 | 3.867 | 2 |
| 7 | [45°/−45°]$_s$ | $D_{16}, D_{26}$ | 20.5 | 20.5 | 37.6 | 0.74 | 24.6 | 11.0 | 0.96 | 5.568 | 2 |
| 8 | [30°/60°/30°/0°] | All | 40 | 23.4 | 14.9 | 0.24 | 27.7 | 10.1 | 0.22 | 8.708 | 3 |

It is noted that the structural x-axis is along the longitudinal cylinder axis. $B_{11}$, $B_{12}$ and $B_{22}$ are extension-bend coupling terms; $B_{16}$ and $B_{26}$ is an extension-twist coupling term; $D_{16}$ and $D_{26}$ are bend-twist coupling terms.

Figure 16:
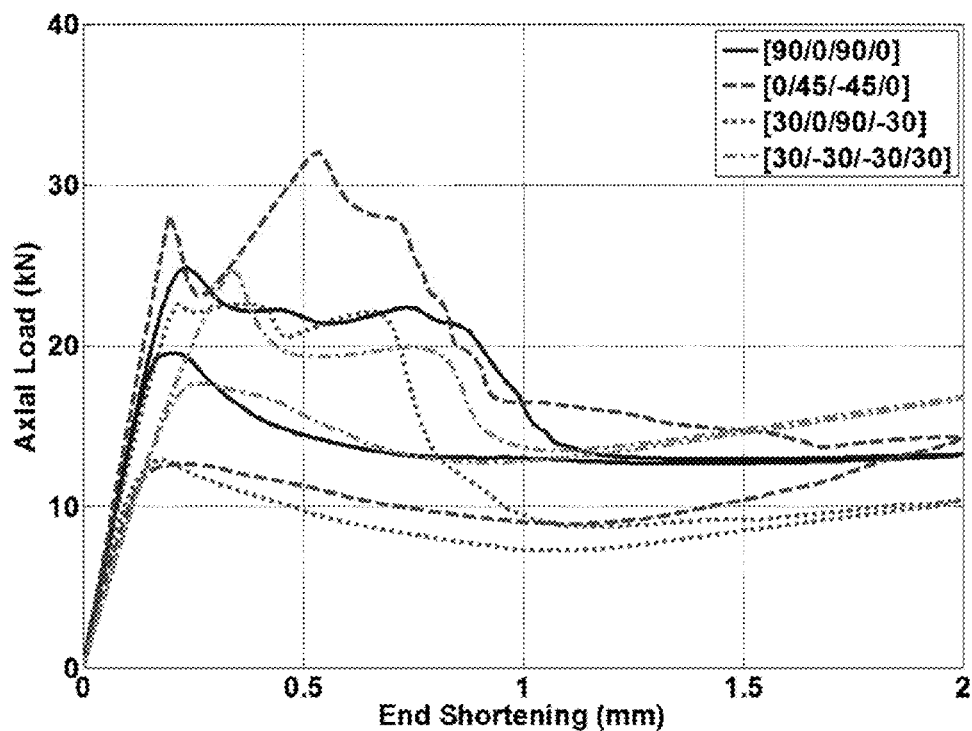
FIG. 16 is a graph illustrating the predicted postbuckling response of cylinders with different laminate designs.
Figure 17A:
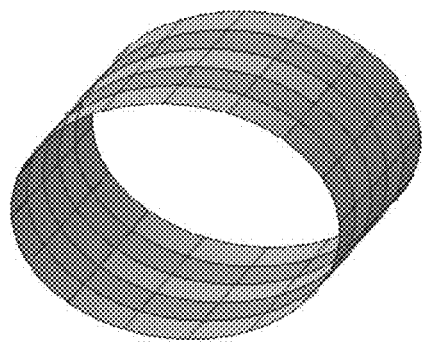
FIGS. 17A-17D are diagrams of cylinder designs with locally varied material stiffnesses.
Figure 17B:
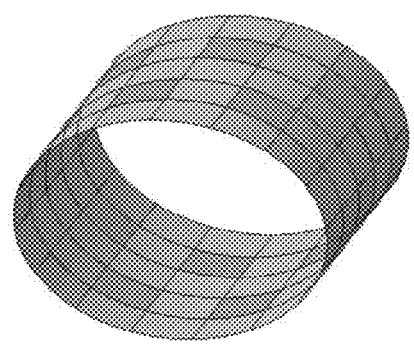
Figure 17C:
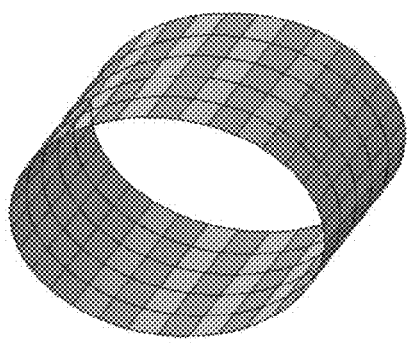
Figure 17D:
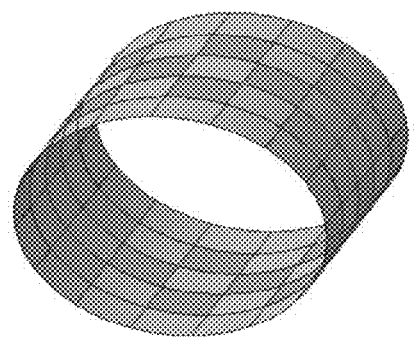

The first buckling mode for Cases 1, 2, 5 and 6 (see Table 1) shown in FIGS. 15A-15D illustrates the influence of laminate stacking sequence on buckling response. FIG. 16 shows the axial load vs. end shortening response of the same designs to illustrate their predicted postbuckling behavior. Table 1 compares the postbuckling response for all cases in terms of the first buckling load (P1), the first load jump (ΔP1), the end shortening gap between the first two mode jumps (δ1), the dissipated energy (A), and the number of mode transitions (k).

A pilot study to evaluate the effects of locally varying material stiffness on the postbuckling response of cylindrical shells is also presented. Typically, local variation of geometry for cylindrical shells refers to stiffeners/ribs along the surface or holes/bumps on the surface; which have a significant effect on buckling load. As noted on the discussion of imperfection sensitivity, the postbuckling response is driven by the extent of imperfections and their amplitude. The aim here was to induce a similar effect through artificial changes on the material properties and their distribution on the cylinder such that dominant buckling modes can be triggered.

A set of eight cylinders (Table 2) with ad-hoc patterned material distributions were considered. The patterns were empirically chosen upon evaluation of the eigenshapes observed from linear and non-linear buckling studies on isotropic and laminated cylinders. The approach to the material layout distributions consisted in providing regions of locally varying (softer) material stiffness. The patterned material distributions were grouped in four categories as shown in FIGS. 17A-17D. For this study the material properties of the base cylinder were assumed to be isotropic with E=14 GPa and ν=0.25, while the locally varying material patches (red zones) were assumed to have half the stiffness of the base material.

M and n are the number of segments along the circumferential and axial direction, respectively; the number in parenthesis is the number of segments with weaker material properties.

Figure 18:
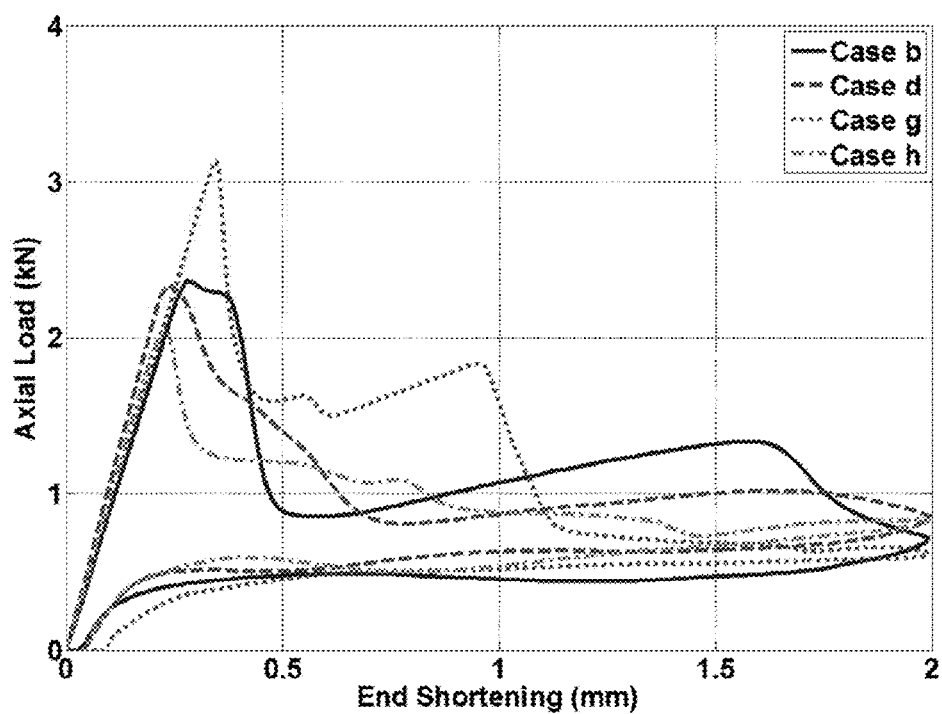
FIG. 18 is a graph illustrating the predicted postbuckling response of cylinders with patterned material layouts.

The postbuckling response of four characteristic cases is shown in FIG. 18, where it can be seen that while the initial stiffness and first bifurcation events are similar the postbuckling responses are quite different. It is interesting to see that cylinders with continuous material stiffness changes (Cases b and g) had large load drops (or ΔP values) in their load-displacement response compared to designs with scattered and checkerboard patterns. In addition, a larger number of mode transitions (jumps) were attained by cases with larger axial stiffness continuity (Cases g and h). Table 2 summarizes characteristic features of the postbuckling response for all eight cases. The results confirm that appropriate patterns can be utilized in controlling postbuckling behavior.

From the discussion and results presented before it is clear that postbuckling response after the first bifurcation is usually characterized by a quick loss of stiffness and load-bearing capacity. The load-displacement responses show that the stiffness is near zero half way along the loading history. This occurs when buckling waves in the longitudinal direction increase in amplitude (in the transverse direction) without the development of a mode transition. Further, it can be observed that the number of local mode transitions obtained in the studied cases with anisotropic coupling or patterned material layouts were no more than six, and no more than two significant load drops during mode transitions were observed. A way to control the growth of transverse deformations and induce multiple post-buckling transitions is to provide lateral restraints to the postbuckling shape. Thus, the effects of unilateral and bilateral constraints on the cylindrical shell were studied by considering three conditions: unilateral outer and inner constraints, respectively, and bilateral constraints. In total, eight cases were considered whereby the lateral constraint or the gap between the constraint and the cylinder were changed, see Table 3.

TABLE 2

Postbuckling response of cylinders with patterned material distributions.

| # | Pattern | m | n | $P_1$ (kN) | $|\Delta P_1|$ (kN) | $\delta_1$ (mm) | A (J) | k |
|---|---|---|---|---|---|---|---|---|
| a | Circumferential | 3(1) | 16 | 2.26 | 1.63 | 1.73 | 0.92 | 2 |
| b | Circumferential | 5(2) | 16 | 2.37 | 1.03 | 1.30 | 1.43 | 3 |
| c | Circumferential | 7(3) | 16 | 2.42 | 1.80 | 1.14 | 0.99 | 3 |
| d | Scatter | 5 | 16 | 2.34 | 1.32 | 1.40 | 1.05 | 2 |
| e | Axial | 5 | 8(4) | 3.19 | 2.48 | 1.37 | 1.44 | 2 |
| f | Axial | 5 | 16(8) | 3.17 | 2.39 | 0.73 | 1.06 | 3 |
| g | Axial | 5 | 32(16) | 3.12 | 1.49 | 0.20 | 1.48 | 4 |
| h | Checkerboard | 5 | 16 | 2.04 | 0.94 | 0.54 | 0.81 | 3 |

TABLE 3

Postbuckling response of cylinders with lateral constraints.

| # | Lateral constraint | Gap (mm) | $P_1$ (kN) | $|\Delta P_1|$ (kN) | $\delta_1$ (mm) | A (J) | k |
|---|---|---|---|---|---|---|---|
| 1 | N/A | N/A | 5.45 | 0.77 | 0.63 | 6.58 | 2 |
| 2 | Outer | 3.5 | 5.45 | 0.82 | 0.61 | 5.74 | 4 |
| 3 | Inner | 3.5 | 5.45 | 0.84 | 0.60 | 6.41 | 6 |
| 4 | Both | 3.5 | 5.45 | 0.86 | 0.59 | 6.04 | 5 |
| 5 | Inner | 2.5 | 5.45 | 0.84 | 0.60 | 5.19 | 6 |
| 6 | Inner | 1.5 | 5.59 | 0.69 | 0.93 | 4.18 | 5 |

The shell molded for this evaluation was a [45°/−45°] graphite/epoxy cylinder. The material properties and stiffness characteristics are as that of Case 7 in Table 1. The reference gap between the cylinder and the rigid constraint was taken to be 3.5 mm, since this was the maximum transverse displacement obtained in the study of Case 7 (Table 1). Reduction in the gap was studied for cases with inner unilaterial constraints since cylindrical shells are more prone to buckle inward due to the geometric constraint from the structure's curvature.

The lateral constraint was assumed to be rigid and was numerically modeled by defining a rigid cylinder and contact interaction parameters between the constraining surfaces and the cylindrical shell. The contact interaction properties were a no-penetration condition in the normal direction to the surfaces and a frictionless response in the tangential direction. Further investigation is needed with consideration of friction between the interacting surfaces. All models in this section were subjected to a 5 mm shortening in the axial direction. The analysis only considered nonlinear elastic response.

Figure 19:
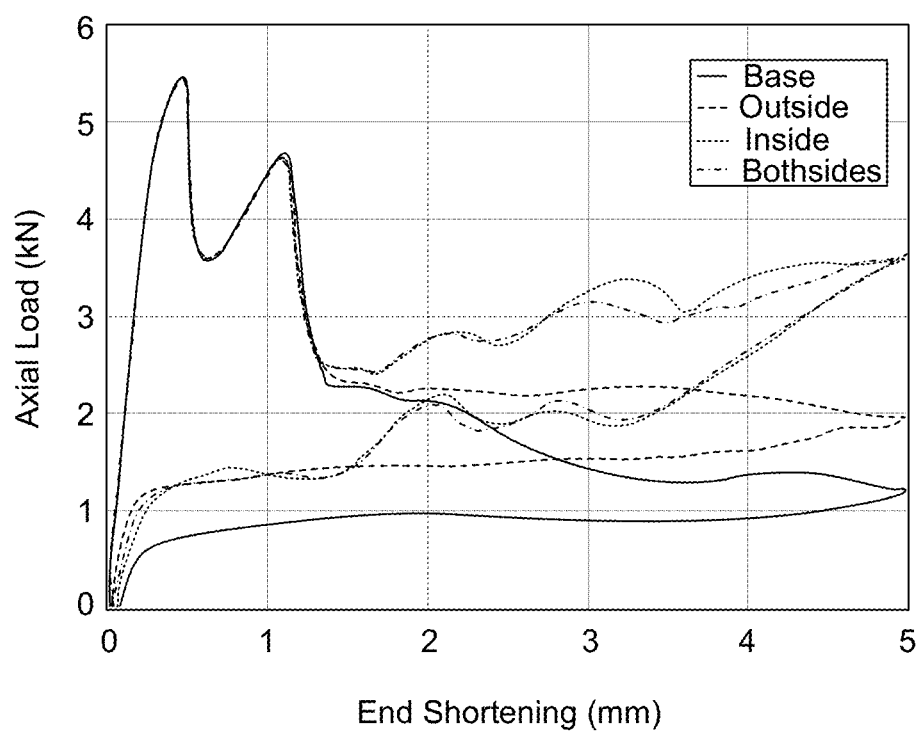
FIG. 19 is a graph illustrating the predicted postbuckling response of laterally constrained laminated cylindrical shells.

The postbuckling responses of Cases 2, 3 and 4 (see Table 3) along with the base or unconstrained shell (Case 1) are plotted in FIG. 19. It can be seen that the outer unilaterally constrained condition did not significantly improve the mode transition response of the base cylinder. Conversely, the unilateral inner constraint allowed the generation of multiple local mode transitions with a noticeable stiffening response, rather than a softening one, after the second major bifurcation event. The bilaterally constrained case did not significantly affect the response achieved with the inner unilateral constraint. A summary of the postbuckling response characteristics of all cases is provided in Table 3.

Figure 20:
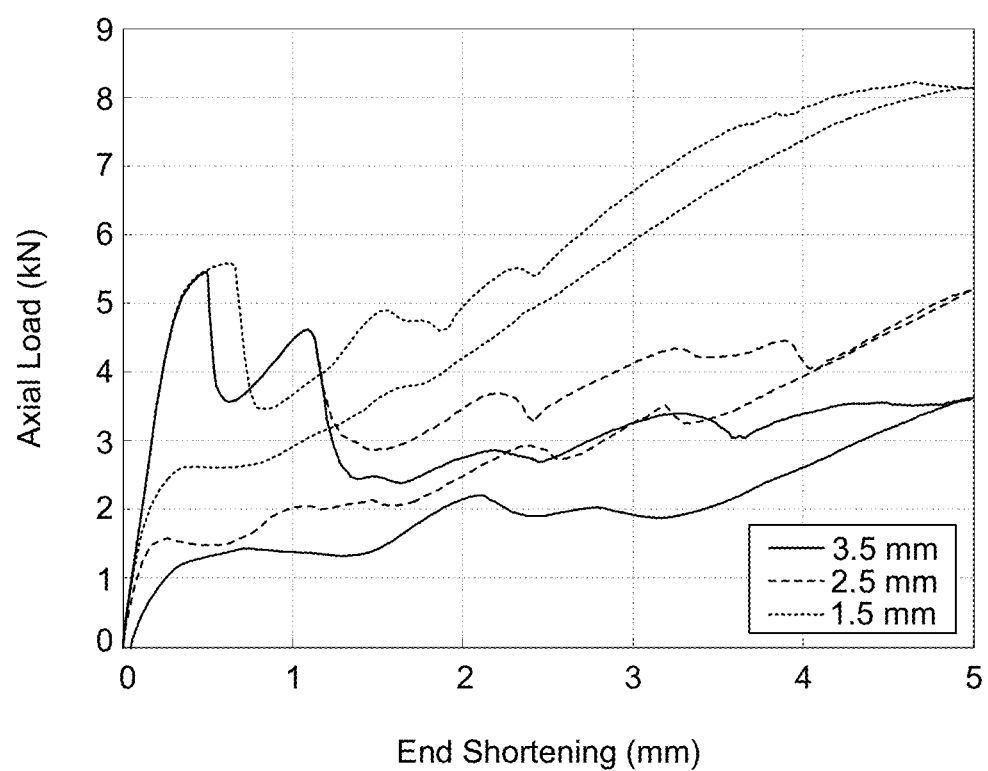
FIG. 20 is a graph illustrating the effect of gap size on the postbuckling response of an inner constrained cylinder.

The postbuckling responses of Cases 5 and 6 (see Table 3) along with the base specimen are plotted in FIG. 20, which shows the influence of the gap size on the postbuckling behavior of the inner unilaterally constrained cases. It can be seen that reducing the gap increases the number of mode transitions and increases the post-buckling stiffening behavior to levels that even surpass the initial buckling load.

Multi-stability refers to the ability of a structure to attain two or more stable geometric configurations and transition between them in an elastic manner upon the application of load. In another aspect of this disclosure, bistability can be provided by the internal state that develops upon cool-down from curing asymmetric angle ply composite laminates. The residual thermal stresses in the thin plates lead to stable shapes with opposing mid-plane curvatures as shown in FIGS. 11A-11D. Bistable and even tristable laminated composite shells investigations have been guided by applications to deployable structures, and morphing or reconfigurable structures.

Figure 12A:
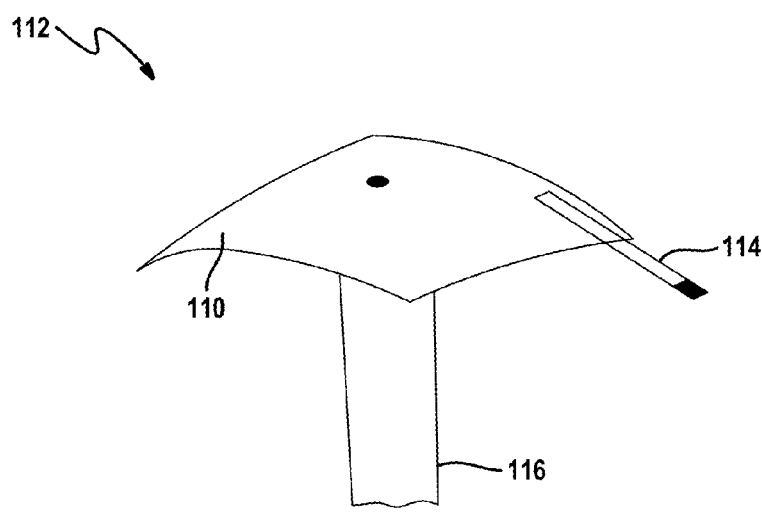
FIG. 12A is a diagram of another embodiment for an energy harvesting device employing bistable laminated plates.
Figure 12B:
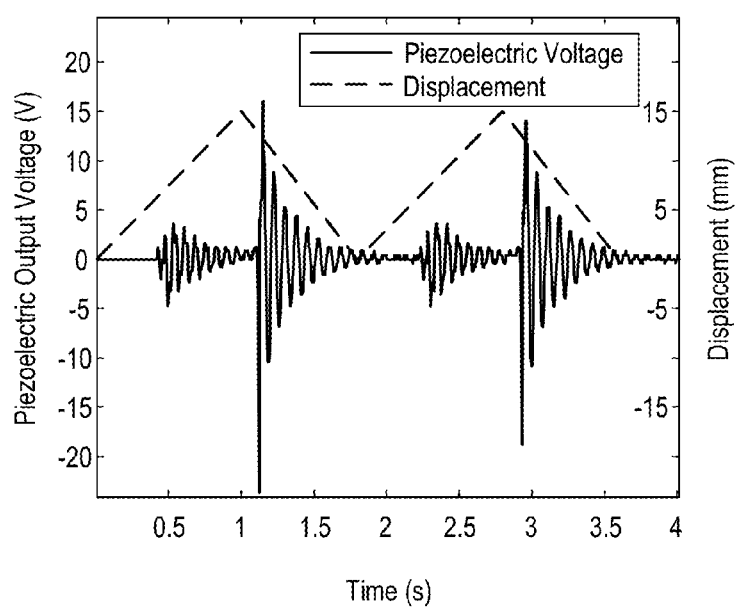
FIG. 12B is a graph illustrating the applied input and the resulting output voltage for the energy harvesting device depicted in FIG. 11.

Bistable laminated plates were manufactured by introducing residual stresses due to thermal cool down from their curing temperature. A PVDF piezoelectric oscillator was mounted on one of the plate's corner in a cantilever configuration as shown in FIG. 12A. The test objective was to illustrate the concept of frequency modulation as previously discussed for the one-dimensional bilaterally constrained columns. The plates were attached at their center to a fixed base. An actuator was moved vertically up and down at very low rates to apply load at two opposing plate corners and induce the snap-through between stable positions in both directions. FIG. 12B shows the piezoelectric output voltage for two full displacement cycles applied to a [−30/60] plate. The actuator was moved at a frequency of 0.55 Hz while the induced oscillations at the PVDF beam were measured at 12.82 Hz. It can be seen from the levels of generated voltage that the transitions are not symmetric between the two stable positions. This can be explained by the levels of residual energy in the system, which is affected by the fiber orientations and the manufacturing process. It can also be noted that the load required to initiate the snap-through event was less than 0.5 N. Thus, this system can also be used for load amplification at low-rate deformations.

Figure 13A:
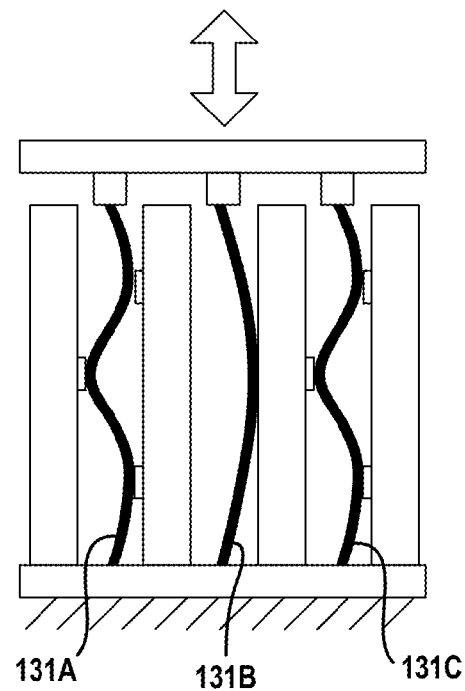
FIGS. 13A and 13B are diagram depicting arrays of energy harvesting devices.
Figure 13B:
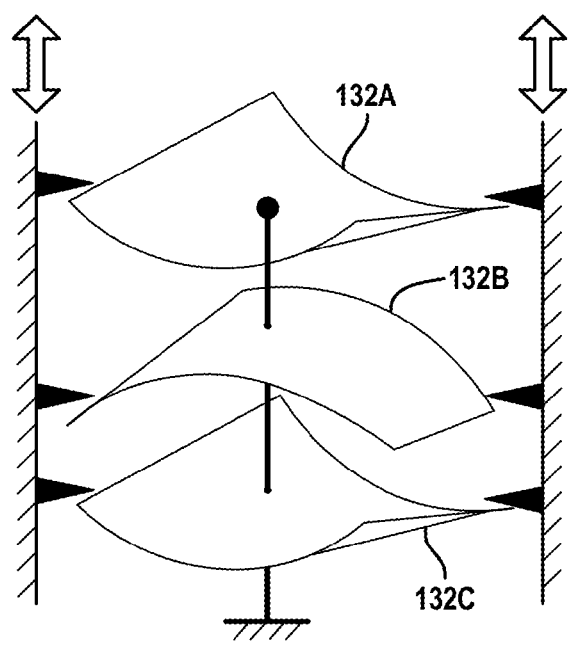

Another option to control the amplitude and frequency output of the piezoelectric harvester is to arrange the mechanical elastic elements in assemblies or arrays. It has been discussed that the post-buckling response of laterally restrained columns and cylinders can attain multiple post-buckling positions. For the bistable plates, this is not possible and the system is essentially monotonic, that is, the snap-through can only occur in one of possible stable directions of the laminate. Both the laterally restrained columns and the bistable plate systems can be enhanced in the number, degree of energy release, and the spacing of the high-rate motion events by creating arrays of elements in series or parallel. Concepts for this output signal tailoring scheme are shown in FIGS. 13A and 13B. In FIG. 13A, three laterally constrained strips are simultaneously loaded but each could have different stiffness, or lateral constraint conditions to modify their unique post-buckling behavior. The response of the system can then be tuned by proper choice of the response of the individual column setups. The tuning or tailoring allows control of the number and magnitude of the mode brank switching (snap-through) events during the post-buckling response of the complete system. FIG. 13B shows a system of bistable plates in series where the lateral grips that generate the load onto the plates to induce the snap-through behavior are spaced at specifically designed locations such that they will induce the snap-through on the pates at different levels of global deformation. The system of bistable plates will then possess multiple high-rate motion events that can be controlled in amplitude and in their spacing.

Figure 14A:
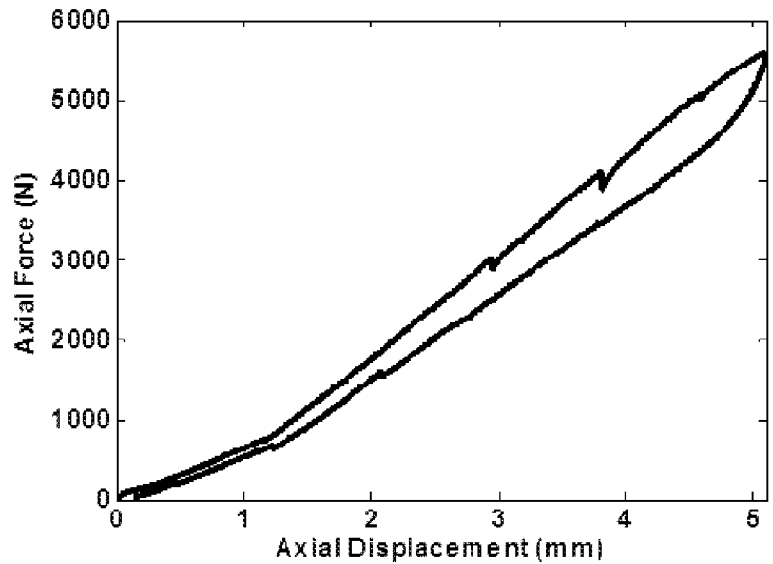
FIGS. 14A and 14B are graphs illustrating the resulting force-displacement response for an array of energy harvesting devices under different load conditions.
Figure 14B:
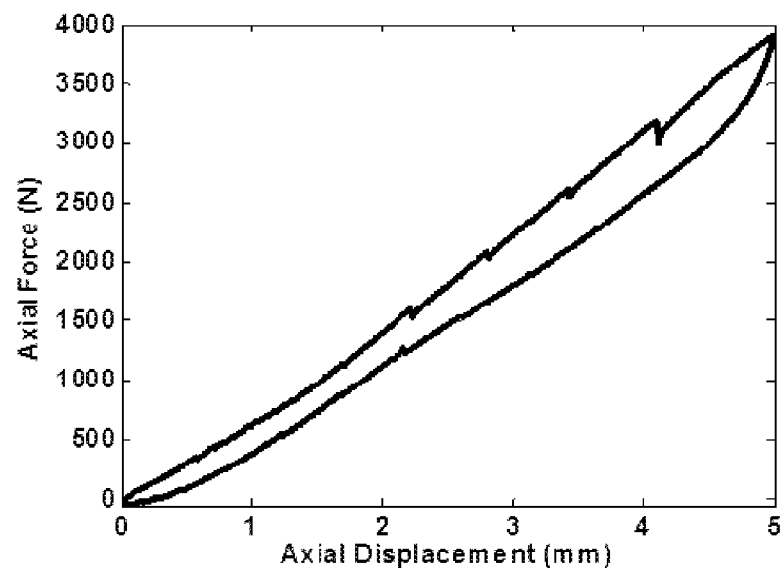
Figure 15A:
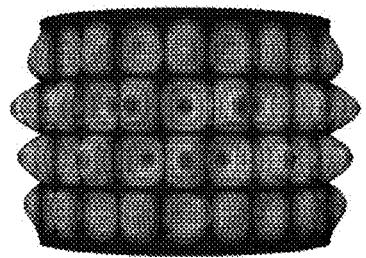
FIGS. 15A-15D are diagrams depicting first buckling mode shapes of composite cylindrical shells with different stacking sequences.
Figure 15B:
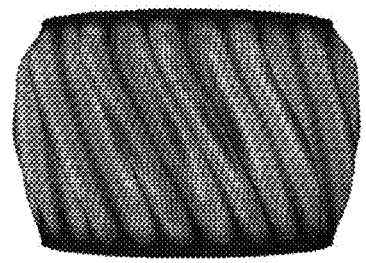
Figure 15C:
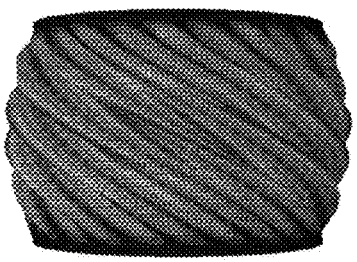
Figure 15D:
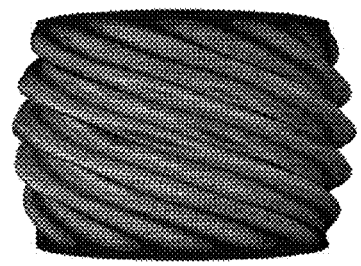

Experimental and numerical studies have been conducted to validate the concept of using arrays of slender elastic strips to increase the number of snap-through events. The setup described above was extended to accommodate three parallel strips with fixed end supports. The constraining walls were kept separated by a 4 mm gap and three columns of the same length were placed inside the gaps adjacent to one of the constraining walls. Two sets of experiments were conducted. In the first experiment, three strips with the same geometry and material properties as described above were used. The strips were axially loaded in compression under displacement control to a total end shortening of 5 mm and then unloaded. The displacement control was applied to the top boundaries of all strips simultaneously. In the second experiment, the thickness of the third strip to the right was reduced to 1.47 mm from the original 2.3 mm, changing only one parameter for better understanding of the observed behavior. The same loading procedure was applied. FIGS. 14A and 14B respectively display the resulting force-displacement response of the system in the first and second experiment. The plots illustrate the controlling effects of reducing the thickness of one of the elements. The number and spacing between transition events significantly changed in the second experiment. These observations show that the number and position of the snap-through events can be controlled. Finite element analyses were performed to further study the sensitivity the post buckling behavior of stacked system parameters such as the strips thickness, young's modulus, and walls gap. It was noted that the number and the locations between the snap-through transitions are very sensitive to the investigated parameters.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An energy harvesting device, comprising:
   a buckling member having a longitudinal axis and configured, to exhibit a snap-through event in response to a force applied axially thereto;
   at least one cantilever having one end coupled to the buckling member and a mass disposed at an opposing end thereof, the cantilever extends outwardly from the buckling member and includes a piezoelectric material disposed on a surface thereof; and
   a constraining member positioned along the longitudinal axis of the buckling member on opposite sides of the buckling member and configured to constrain the buckling member laterally during the snap-through event.

2. The energy harvesting device of claim 1 wherein the buckling member is configured to respond to a force occurring at a frequency less than one Hertz.

3. The energy harvesting device of claim 1 wherein the buckling member is configured to exhibit snap-through events between three or more stable positions, and the constraining member is in contact with the buckling member in each of the three or more stable positions such that the buckling member is compressed along the longitudinal axis in each of the three or more stable positions.

4. The energy harvesting device of claim 1 wherein the buckling member is further defined as a strip, where the strip is comprised of two opposing planar surfaces substantially larger than remaining surfaces of the strip.

5. The energy harvesting device of claim 4 further comprises a first wall disposed adjacent to a first of the planar surfaces of the strip and a second wall disposed adjacent to a second of the planar surface of the strip, such that the columns laterally constrain the snap-through events of the strip.

6. The energy harvesting device of claim 1 wherein the buckling member is further defined as a hollow cylinder, such that the snap-through event are generated due to constraint by the cylinder geometry.

7. The energy harvesting device of claim 1 wherein the cantilever is orientated substantially transverse to the longitudinal axis of the buckling member.

8. The energy harvesting device of claim 1 wherein the piezoelectric material of the cantilever is electrically connected via a circuit to an energy storage device.

9. The energy harvesting device of claim 1 is encased in a cylindrical housing and disposed in a structure for energy harvesting.

10. An energy harvesting device, comprising:
    a strip defining a longitudinal axis and having two opposing planar surfaces substantially larger than remaining surfaces of the strip;
    at least one cantilever having one end coupled to the strip and a mass disposed at an opposing end of cantilever, wherein the cantilever extends outwardly from the strip;
    a piezoelectric material disposed on at least one surface of the cantilever;
    a first wall disposed adjacent to one of the planar surfaces of the strip and a second wall disposed adjacent to the other of the planar surface of the strip, wherein the strip exhibits a snap-through event in response to a force applied axially thereto and the first and second walls laterally constrain the snap-through event of the strip.

11. The energy harvesting device of claim 10 wherein the buckling member is configured to respond to a force occurring at a frequency less than one Hertz.

12. The energy harvesting device of claim 10 wherein the buckling member is configured to exhibit snap-through events between three or more stable positions, and the first wall and the second wall are in contact with the buckling member in each of the three or more stable positions such that the buckling member is compressed along the longitudinal axis in each of the three or more stable positions.

13. The energy harvesting device of claim 10 wherein the cantilever is orientated substantially transverse to the longitudinal axis of the strip.

14. The energy harvesting device of claim 10 wherein the piezoelectric material of the cantilever is electrically connected via a circuit to an energy storage device.

15. The energy harvesting device of claim 10 is encased in a cylindrical housing having two end caps and a means for compressive preloading an axial force on one end of the strip.

16. An energy harvesting device, comprising:
    a buckling member having a longitudinal axis and configured, in response to a force applied axially thereto, to exhibit snap-through events amongst three or more stationary positions;
    at least one cantilever having one end coupled to the buckling member and a mass disposed at an opposing end thereof, the cantilever extends outwardly from the buckling member and includes a piezoelectric material disposed on a surface thereof; and
    a constraining member positioned adjacent to the buckling member along the longitudinal axis of the buckling member and in contact with the buckling member in each of the three or more stationary positions such that the buckling member is compressed along the longitudinal axis in each of the three or more stable positions.

* * * * *